(12) United States Patent
Krief

(10) Patent No.: US 6,617,815 B1
(45) Date of Patent: Sep. 9, 2003

(54) FAN CONTROL CIRCUIT

(75) Inventor: Jérome Krief, St Jean de Vaulx (FR)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/291,897

(22) Filed: Apr. 14, 1999

(30) Foreign Application Priority Data

Jan. 15, 1999 (EP) .............................................. 99400114

(51) Int. Cl.[7] .......................... G05B 5/00; G05D 23/00; H02H 7/08; H02P 1/04; H02P 3/00
(52) U.S. Cl. ...................... 318/471; 236/74 R; 388/934; 318/473; 318/806
(58) Field of Search ................................. 318/471, 472, 318/473, 806; 236/74 R, 73, 67, 84, 91 F, 91 G; 322/33, 34; 388/934

(56) References Cited

U.S. PATENT DOCUMENTS

| | | | |
|---|---|---|---|
| 2,991,405 A | | 7/1961 | Carlson |
| 4,475,071 A | * | 10/1984 | Yoshizawa ................... 388/934 |
| 4,659,290 A | * | 4/1987 | Kundert ....................... 318/473 |
| 4,722,669 A | * | 2/1988 | Kundert ....................... 318/473 |
| 4,806,832 A | * | 2/1989 | Muller ......................... 318/471 |
| 5,125,571 A | * | 6/1992 | Heber ........................ 236/49.3 |
| 5,197,858 A | * | 3/1993 | Cheng ......................... 318/473 |
| 5,249,741 A | | 10/1993 | Bistline et al. |
| 5,363,024 A | * | 11/1994 | Hiratsuka et al. ............ 318/472 |
| 5,457,766 A | * | 10/1995 | Ko .............................. 318/471 |
| 5,687,079 A | | 11/1997 | Bauer |
| 5,825,972 A | * | 10/1998 | Brown ........................ 388/811 |
| 5,831,405 A | * | 11/1998 | Massie ........................ 318/471 |
| 5,926,386 A | * | 7/1999 | Ott et al. ..................... 318/471 |
| 5,929,581 A | * | 7/1999 | Van Brocklin et al. ..... 318/471 |
| 6,191,546 B1 | * | 2/2001 | Bausch et al. .............. 318/471 |

FOREIGN PATENT DOCUMENTS

EP 0090514 A1 10/1983

OTHER PUBLICATIONS

IBM Technical Disclosure Bulletin, vol. 32. No. 10A, Mar. 1990.
Pp. 4–68 of "Motorola Small–Signal Semiconductors".

* cited by examiner

*Primary Examiner*—Robert E. Nappi
*Assistant Examiner*—Edgardo San Martin

(57) ABSTRACT

The invention relates to a motor control circuit for a computer system fan motor, comprising a temperature sensor, a sensor amplifier, a fan command for applying a voltage to the fan motor according to the output of the sensor amplifier, and feedback control means. The circuit of claim also comprises means for stopping the supply of voltage across the fan motor terminals, irrespective of the output of the temperature measuring means. The sensor amplifier allows easy setting of the parameters of the voltage according to the temperature measured by the temperature sensor.

22 Claims, 2 Drawing Sheets

FAN CONTROL CIRCUIT

FIELD OF THE INVENTION

The invention relates to the field of computers, and more specifically to the control of computer fans.

BACKGROUND OF THE INVENTION

Most computers or similar electronic devices comprise air cooling systems, with one or more fans. These fans are operated by DC controlled motors. One of the problems encountered with such fans, in office environment, is the problem of the noise of the motor running the fans, and the noise of the fan itself.

Several solutions to this problem have already been proposed.

Variable air cooling for computer and/or electronic equipment, IBM Technical Disclosure Bulletin, vol. 32. no 10A, March 1990, discloses the use of a motor having multiple windings, controlled by a thermistor. The thermistor is mounted near to the air input, and varies the speed of the motor by switching to different winding taps according to the temperature of the ambient air.

EP-A-0 090 514 discusses the drawbacks of a limited number of possible speeds, and discloses a circuit for controlling a DC motor for a fan. This circuit uses a thermistor and an integrated circuit voltage regulator for supplying a variable voltage to the DC motor, according to the temperature detected by the thermistor.

U.S. Pat. No. 5,249,741 discloses a computer system with fans, where the required fan speed is stored in a register; the stored digital value is converted to an analog value for driving a power supply unit. The power supply unit provides to the fan motor a DC voltage representative of the analog value supplied by the digital analog converter. The speed value of a fan is determined at boot based on the cooling requirements of each of the components of the computer system, the cooling requirements being stored in the system. There is no provision in this document for changing the speed value for a fan during operation of the computer system.

U.S. Pat. No. 2,991,405 teaches the use of a thermistor connected to the base of a transistor for controlling the current supplied through the transistor to a motor in a temperature control system.

U.S. Pat. No. 5,687,079 discloses a computer fan control circuit; it suggests controlling the speed of the fan in a computer, according to the temperature of the ambient air detected by a thermistor. The current supplied to the motor operating the fan is controlled by a transistor. The base of the transistor is connected to a circuit comprising a thermistor. A low temperature voltage divider provides a constant low voltage to the motor when air temperature is below 28° C. A high temperature voltage divider provides a constant high voltage to the motor when air temperature is above 40° C. Thus, voltage supplied to the motor is constant below 28° C., increases linearly, and is again constant above 40° C.

These prior art circuits suffer a number of drawbacks. Some are not based on common components, and are therefore costly to manufacture. They do not ensure that the fan will start, when operated at the minimal speed.

For a temperature control of the type shown in U.S. Pat. No. 5,687,079, three independent parameters need to be set. The first is the minimal fan speed Vmin. The second is the lower temperature Tmin below which the fan will operate at its minimum speed. The third one is the upper temperature Tmax above which the fan will operate at its maximum speed. The prior art circuits do not allow easy control of these three parameters; however, these parameters need to be adapted to the type of computer system in which the fan is used.

In addition, the maximum voltage supplied to the fan motor should preferably be as close as possible to the maximum available voltage.

Finally, it is useful that the fan motor be driven as accurately as possible.

SUMMARY OF THE INVENTION

Therefore, there is a need for a fan motor control circuit providing a solution to one or more of the problems discussed above. The invention thus provides a fan motor control that is easy to manufacture, uses only common components, provides easy setting of the minimal speed, of the lower temperature, and of the upper temperature, ensures that the fan motor will start even when operated at minimal speed. The invention also ensures that the maximum voltage supplied to the motor is close to the maximum available voltage. In addition, the circuit of the invention allows the fan motor to be stopped using a TTL general purpose input/output.

The invention provides a motor control circuit for a computer system fan motor, comprising temperature measuring means outputting a signal representative of the voltage to be applied across fan motor terminals, and feedback control means for applying a voltage across fan motor terminals according to said signal.

In one embodiment of the invention, the circuit further comprises means for stopping the supply of voltage across the fan motor terminals, irrespective of said signal.

In case where the voltage applied to the fan motor varies between a lower voltage and a higher voltage, the circuit preferably comprises means for applying a pulse of the higher voltage to the fan motor terminals when the motor is started, irrespective of the output of the temperature measuring means.

In another embodiment, the circuit further comprises a capacitor in parallel to the fan motor terminals.

The temperature measuring means may comprise a temperature sensor and a sensor amplifier, the temperature sensor comprising a thermistor.

In one embodiment, the sensor amplifier comprises an comparator for comparing the voltage across the thermistor with a reference voltage and for outputting a difference signal representative of the difference between the voltage across the thermistor and the reference voltage, said sensor further comprising means for adding to said difference signal a signal representative of a lower value of said signal.

Preferably, the feedback control means comprise subtracting means, fan control means, and feedback loop means, said subtracting means receiving the signal outputted by said temperature sensing means and a signal outputted by said feedback loop means, and outputting to the fan control means a signal representative of the difference between the signal outputted by said temperature sensing means and the signal outputted by said feedback loop means, said fan control means applying across said fan motor terminals a voltage representative of the signal supplied by the subtracting means, said feedback loop means outputting to said subtracting means a signal representative of the voltage applied to the fan motor terminals.

In this case, the subtracting means preferably comprise an amplifier, the positive input of which receives the signal outputted by said temperature sensing means and the negative input of which receives a signal outputted by said feedback loop means.

The fan control means may comprise a power transistor, the collector of which is connected to one of the fan motor terminals, the emitter of which is connected to one of the ground and power supply, and the base of which is connected to the output of said subtracting means, the other of said fan motor terminals being connected to the other of said ground and power supply.

The means for stopping may then comprise a transistor, the collector of which is connected to the base of said power transistor, the emitter of which is connected to the ground, and the base of which receives a fan stopping signal.

Preferably, the feedback loop means comprise a comparator for comparing the voltage across the fan motor terminals to a reference voltage, and for outputting a signal representative of said difference.

In one embodiment, a highest voltage applied to said feedback control means is less than a highest voltage applied to the fan motor terminals, and the feedback loop means compensate for the difference between said highest voltage applied to the fan motor terminal and said highest voltage applied to said feedback control means.

The invention also relates to a computer including a fan motor connected to such a circuit.

BRIEF DESCRIPTION OF THE DRAWINGS

Other features and aspects of the invention will appear upon reading of the following description of the preferred embodiments, in conjunction with the accompanying drawings, in which.

DETAILED DESCRIPTION OF THE INVENTION

Figure 1:
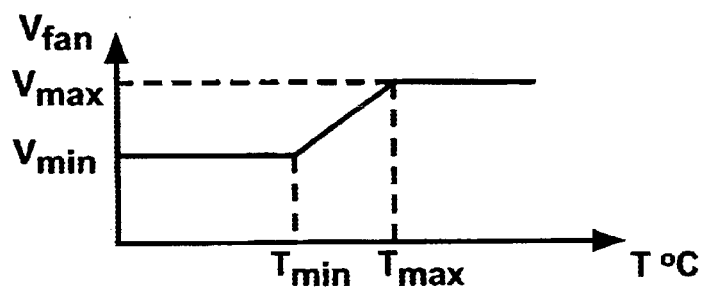
FIG. 1 shows a curve of the voltage supplied to a motor according to the temperature in a circuit of the invention.

FIG. 1 shows a curve of the voltage supplied to a motor in a circuit according to the invention. The vertical axis shows the voltage, and the horizontal axis the temperature measured at the temperature sensor. Below a lower temperature $T_{min}$, a constant voltage $V_{min}$ is supplied to the motor. Above a higher temperature $T_{max}$, a constant voltage $V_{max}$ is supplied to the motor. Between $T_{min}$ and $T_{max}$, the voltage supplied to the motor is a linear function of the temperature, and varies between $V_{min}$ and $V_{max}$.

In a computer system, the maximum voltage Vmax is preferably as close as possible to the maximum available voltage, that is 12 V in standard Personal Computer type computers. This allows the fan to be operated at the maximum possible speed.

The other three parameters, Vmin, Tmin and Tmax may be adapted according to the type of computer, that is to the chassis and to the cooling requirements of the different components of the computer. Naturally, these parameters may be expressed differently, e.g. by Tmin and Vmin and the slope dV/dT of the linear part of the voltage curve between Tmin and Tmax.

Figure 2:
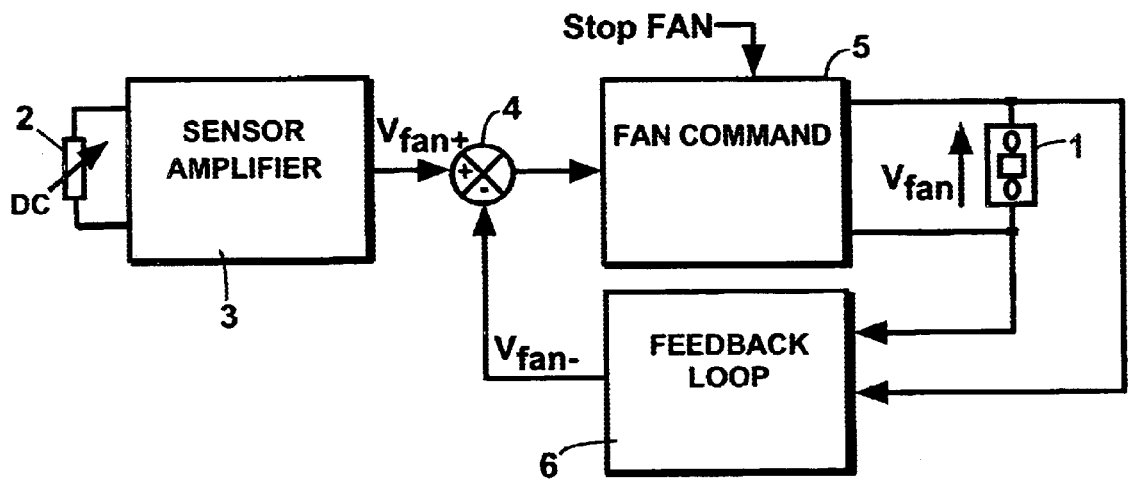
FIG. 2 is a diagrammatic representation of a circuit according to the invention.

FIG. 2 is a diagrammatic representation of a circuit according to the invention. It shows the fan motor 1, connected to the fan motor terminals of the circuit, and the temperature sensor 2, in the embodiment a 3.3 kOhm NTC thermistor of the type sold by Murata or Siemens; such a thermistor has a resistance varying from 3300 to 1183 Ohms on a range of temperature from 25 to 50° C.; preferably, this thermistor is located on the backplane of the chassis of the computer, in the middle of the box, where its temperature is representative of the temperature of the different components of the computer.

FIG. 2 further shows a sensor amplifier 3. The temperature measured by the temperature sensor is supplied to the sensor amplifier. It outputs a voltage Vfan+ representative of the voltage to be applied to the motor, and having the type of variation shown on the curve of FIG. 1.

The voltage Vfan+ is supplied to a subtractor 4, that also receives a voltage Vfan− representative of the voltage applied to the motor. The difference Vfan+−Vfan− of these two voltages is outputted to a fan command 5.

The fan command 5 receives the voltage difference and according to this difference outputs a fan command voltage Vfan to the fan motor terminals. Preferably, as shown on FIG. 2, the fan command also has a stop fan input, for stopping the fan. Applying a given voltage level—e.g. a logical high level—on this input has the effect of stopping the voltage supply to the motor, so as to stop the motor.

The fan command voltage Vfan is supplied to a feedback loop 6; the feedback loop output the Vfan− voltage to the subtractor 4.

The operation of the circuit of FIG. 2 is the following. The measuring means, comprised of the temperature sensor 2 and of the sensor amplifier 3, provide a voltage representative of the voltage to be applied to the fan motor 1. This voltage is applied to the fan motor using feedback control means, comprised of the fan command 5, of the feedback loop 6, and of the subtractor 4.

When and if the computer system enters into a suspend or sleep mode, the fan motor may be switched off, using the stop fan input. The stop fan command may be supplied as soon as the computer enters into the sleep mode, or there may be provided a delay period during which the fan is operated, while the computer system is in a suspend mode.

The circuit of FIG. 2 has the advantage of applying a stable and accurate voltage to the fan motor, thanks to the feedback control. The feedback control also limits the effects of component dispersion, and makes it possible to use for the manufacture of the circuit usual components.

Figure 3:
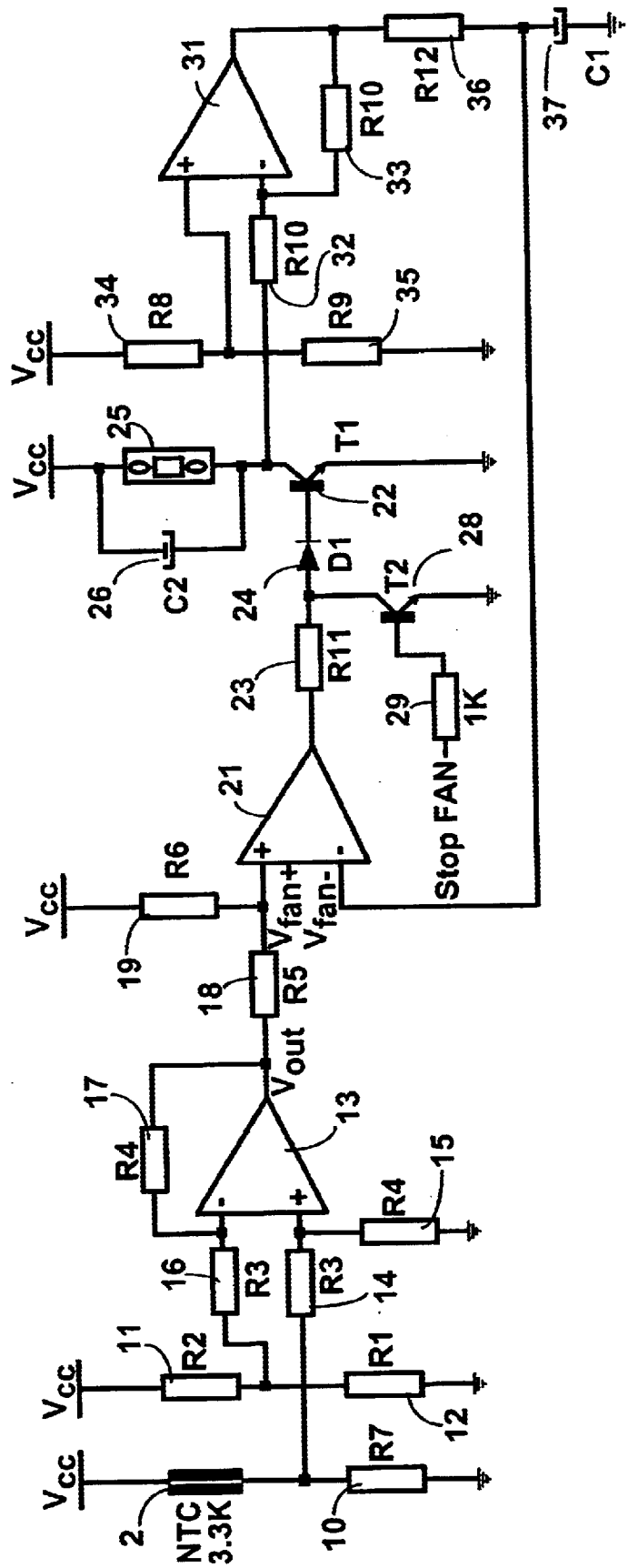
FIG. 3 is a detailed diagrammatic representation of an embodiment of the circuit of the invention.

FIG. 3 is a detailed diagrammatic representation of an embodiment of the circuit of the invention. It shows a possible implementation of the different blocks of FIG. 2.

In the embodiment of FIG. 3, the sensor amplifier 3 is based on a operational amplifier 13, used as a comparator. The NTC thermistor 2 is connected in series with a resistor R7 referenced 10 between Vcc and ground, with Vcc the 12 V voltage provided in usual computer systems. A resistor R2 referenced 11 is also connected in series with a resistor R1 referenced 12 between Vcc and ground.

The positive input of the amplifier 13 is connected between the thermistor 2 and the resistor R7, through a resistor 14 having a resistance R3. The positive input is also connected to the ground through a resistor 15 having a resistance R4. The negative input of the amplifier 13 is connected between the resistors R2 and R1, through a resistor 16 having a resistance R3. A resistor 17 having a resistance R4 is connected in feedback between the negative input and the output of the amplifier.

The voltage Vout at the output of the amplifier 13 is given by the following formula $$Vout = Vcc \frac{R4}{R3} \cdot \left( \frac{R7}{R7+NTC} - \frac{R1}{R1+R2} \right)$$

when the resistance NTC of the thermistor is sufficiently low that R7/(R7+NTC) is higher than R1/(R1+R2). Otherwise, the output of the amplifier is grounded.

Thus, the amplifier 13 amplifies the slope of the temperature sensor 2, setting a threshold at Tmin; Tmin may easily be adjusted using the resistors 11 and 12, so as to adjust the resistance R2 and R1. The comparator therefore compares the voltage across the thermistor with a reference voltage given by R1 and R2; it outputs a difference signal Vout representative of the difference between these two voltages.

The slope dV/dT of the voltage curve may be adjusted using the resistors 14, 15, 16 and 17, so as to adjust the ratio R4/R3.

The output of the amplifier 13 is further connected to Vcc by two resistors 18 and 19 in series, having respective resistance of R5 and R6. These two resistors add a minimum voltage Vmin to the output of the first amplifier; Vmin may be adjusted using the resistors 18 and 19, so as to adjust the resistance R5 and R6. The two resistor thus act as means for adding a lower voltage Vmin to the output of the comparator.

The voltage Vfan+ to be applied to the fan motor is available between the resistors 18 and 19, and is given by the following formula:

$$Vfan += Vcc \frac{R5}{R5+R6} + Vcc \frac{R4}{R3} \cdot \frac{R6}{R5+R6} \cdot \left( \frac{R7}{R7+NTC} - \frac{R1}{R1+R2} \right)$$

The temperature sensor, and the temperature amplifier in the embodiment of FIG. 3 allow easy setting of the independent parameters of the voltage curve of FIG. 1. As explained above, Vmin is equal to Vcc*R5/(R5+R6), and may be set by adjusting the values R5 and R6 of the resistors; the minimum value is chosen so as to have the minimum noise in the computer.

The value Tmin may be set by adjusting the values of the resistance R1 and R2, and if necessary R7, so that R7/(R7+ NTC) is equal to R1/(R1+R2) at the value of NTC for the temperature Tmin.

The slope dV/dT is adjusted by varying the values of the resistance R4 and R3. Indeed, as appears from the formula giving Vfan+, once R5, R6 and R7 are set, voltage Vfan+ has a slope that depends linearly on the ratio R4/R3.

An amplifier 21 is used as subtractor for the feedback loop control of the motor; the positive input of the amplifier is connected between the resistors 18 and 19; it receives the voltage Vfan+. The negative input of the amplifier receives the voltage provided by the feedback loop, as explained below.

The output of the amplifier 21 is connected to the base of a power transistor T1, referenced 22, through a resistor 23 and a diode 24. The fan motor 25 is connected between Vcc and the collector of the transistor 22, while the emitter of the transistor 22 is grounded. Thus, the voltage applied to the fan motor 25 is controlled by the power transistor 22, according to the sign of the difference between the voltages Vfan+ and Vfan− applied to the amplifier 21. A voltage from 6 V to 0 V is thus applied to the base of the transistor T1.

Preferably, the power transistor 22 is a NPN transistor, so as to reduce the voltage drop across the transistor. The saturation voltage between the collector and emitter of the transistor may have a value as low as 0.2 V, so that the maximum voltage applied to the motor is near to Vcc. This transistor may be a 500 mA/3 W transistor for large fans, or a 250 mA/1.5 W transistor for small fans.

In addition, if it is necessary to be able to suspend the motor of the fan, there is provided a second transistor T2 referenced 28. The collector of the transistor is connected between the resistor 23 and the diode 24. The emitter of the transistor is grounded, and the base of the transistor is connected to the stop fan input, through a load resistor 29, e.g. a 1 kohm resistor. The transistor may be a FET, or an open collector buffer.

In normal operation, the stop fan input is at a logical low level, so that the transistor T2 is blocked; in this case, the power transistor T1 is controlled by the voltage applied to its base by the amplifier 21. When a logical high level signal is applied to the stop fan input, the transistor T2 is closed, and the base of the power transistor T1 is brought to the ground, so that the power transistor is blocked. This stops the fan motor.

Diode 24 ensures that the power transistor is blocked when the stop fan input is asserted. It may be done without according to the specifications of the power transistor.

According to one feature of the invention, a capacitor 26 with a capacitance C2 is connected in parallel to the motor. This capacitor avoids low speed oscillation of the circuit, and reduces noise. The value of the capacitance C2 is chosen according to the resistance Rm of the motor; a value of the capacitance C2 around 22 microF is appropriate.

In the embodiment of FIG. 3, the structure of the feedback loop is the following. The feedback loop comprises a third amplifier 31; the negative input of the amplifier is connected to the collector of the power amplifier through a resistor R10 referenced 32. A resistor R8 referenced 34 is connected in series with a resistor R9 reference 35 between Vcc and ground. The positive input of the amplifier 31 is connected between the resistors 34 and 35. A feedback resistor R10 referenced 33 is connected between the negative input of the amplifier and its output.

The output of the amplifier 31 is connected through a resistor R12 referenced 36 to the negative input of the second amplifier 21. In addition, the negative input of the amplifier is grounded by a capacitor 37 having a capacitance C1.

The voltage Vfan− applied to the negative input of the amplifier 21 by the feedback loop is given by the following formula:

$$Vfan -= Vcc \cdot \left( 1 - \frac{2R9}{R8+R9} \right)$$

The feedback loop thus withdraws from the voltage applied to the motor an offset determined by the resistance R8 and R9. This allows proper operation of the circuit, even if the amplifier 21 of the fan command cannot manage orders up to Vcc, but only below this value. In the case where Vcc is 12 V, and when the amplifier is a LM324, it may only manage input voltages up to 10.5 V. The offset of the feedback loop makes it possible to apply a 12 V voltage to the fan motor, even though the amplifier 21 only accepts voltages up to 10.5 V. Thus, the feedback loop compensates for the difference between the highest voltage applied to the fan motor and the highest voltage applied to the fan command amplifier 21.

The resistor 36 and the capacitor 37 ensure that the voltage applied to the motor when it is started is near to Vcc. This ensures that the motor will start; in some cases, applying Vmin only to the motor could have the effect of preventing the motor from starting. Thus, a Vcc pulse is applied to the motor when it is started; the duration of the pulse is set by the value of the time constant R12.C1.

The operation of the circuit of FIG. 3 may be derived from the explanation given in reference to FIGS. 2 and 3.

For the setting of the parameters of the circuit, the thermal engineer may proceed as follows: first, according to the specifications of the amplifier 21, the value of the resistance R8 and R9 are determined, so as to compensate the possible maximum value of voltage accepted by the amplifier.

At the same time, the resistance R12 and the capacitance C1 may be chosen, so that the time constant R12.C1 is sufficient to ensure that the fan motor will start. A time constant of 0.5 s or 1 s is appropriate.

The values of Tmin may then be set, using resistance R1 and R2, according to the temperature sensor and the value of R7. The values Vmin and the slope dV/dT may also be set, using the resistance of the various resistors, as explained above.

The following components may be used for the circuit of FIG. 3. The amplifiers 13, 21 and 31 may be amplifiers sold under the reference LM 324 by NS, SGS, TI or other suppliers. The temperature sensor 2, the power transistor 22 and the stop fan transistor T2 were discussed above. The fan motor may be any 12 V model such as those provided by Delta or NMB. The other components are usual passive components.

The following table shows possible values of the different resistance and capacitance, where these components are used, and for
Vcc=12 V
Vmin=6 V
Tmin=28° C.
Tmax=37° C.,
thus with a slope dV/dT of 0.6 V/° C. For the LM324 amplifier, the maximum input voltage is around 10.5 V for a Vcc of 12 V.

| R1 | R2 | R3 | R4 | R5 | R6 | R7 |
|---|---|---|---|---|---|---|
| 1.46 | 10 | 5.3 | 100 | 39 | 84 | 390 |
| R8 | R9 | R10 | R11 | R12 | C1 | C2 |
| 1.5 | 1.2 | 400 | 470 | 270 | 4.7 | 22 |

The values of resistance in this table are given in kOhm and the values of capacitance in microF. The invention is not limited to the embodiments discussed and disclosed. Thus, there are other possible implementations of the circuit of FIG. 2 than the one discussed in reference to FIG. 3.

What is claimed is:

1. A motor control circuit for a computer system fan motor, comprising a temperature measuring circuit for outputting a signal representative of the voltage to be applied across fan motor terminals, and a feedback control arrangement for applying a voltage across fan motor terminals according to said signal, wherein the feedback control arrangement comprises subtraction circuitry, fan control circuitry, and a feedback loop, said subtraction circuitry receiving the signal outputted by said temperature sensing circuit and a signal outputted by said feedback loop, and outputting to the fan control circuitry a signal representative of a difference between the signal outputted by said temperature sensing circuit and the signal outputted by said feedback loop, said fan control subtraction circuit applying across said fan motor terminals a voltage representative of the signal supplied by the subtraction circuitry, said feedback loop outputting to said subtraction circuitry a signal representative of the voltage applied to the fan motor terminals.

2. The circuit of claim 1, further comprising circuitry for stopping the supply of voltage across the fan motor terminals, irrespective of said signal.

3. The circuit of claim 1, wherein the voltage applied to the fan motor varies between a lower voltage and a higher voltage, the circuit further comprising circuitry for applying a pulse of the higher voltage to the fan motor terminals when the motor is started, irrespective of the output of the temperature measuring circuit.

4. The circuit of claim 1, further comprising a capacitor in parallel to the fan motor terminals.

5. The circuit of claim 1, wherein the temperature measuring circuit comprise a temperature sensor and a sensor amplifier, the temperature sensor comprising a thermistor.

6. The circuit of claim 5, wherein the sensor amplifier comprises a comparator for comparing the voltage across the thermistor with a reference voltage and for outputting a difference signal representative of the difference between the voltage across the thermistor and the reference voltage, said sensor further comprising circuitry for adding to said difference signal a signal representative of a lower value of said signal.

7. The circuit of claim 1, wherein the subtracting circuitry comprises an amplifier, the positive input of which receives the signal outputted by said temperature sensing circuit and the negative input of which receives a signal outputted by said feedback loop.

8. The circuit of claim 1, wherein the fan control circuitry comprises a power transistor, the collector of which is connected to one of the fan motor terminals, the emitter of which is connected to one of the ground and power supply, and the base of which is connected to the output of said subtracting means, the other of said fan motor terminals being connected to the other of said ground and power supply.

9. The circuit of claim 8, wherein said circuitry for stopping comprise a transistor, the collector of which is connected to the base of said power transistor, the emitter of which is connected to the ground, and the base of which receives a fan stopping signal.

10. The circuit of claim 1, wherein the feedback loop comprises a comparator for comparing the voltage across the fan motor terminals to a reference voltage, and for outputting a signal representative of said difference.

11. The circuit of claim 1, wherein a highest voltage applied to said feedback control circuitry is less than a highest voltage applied to the fan motor terminals, and wherein the feedback loop compensate for the difference between said highest voltage applied to the fan motor terminal and said highest voltage applied to said feedback control circuit.

12. A computer comprising a fan motor connected to a circuit, the circuit comprising:

a temperature measuring circuit for outputting a signal representative of the voltage to be applied across fan motor terminals;

a capacitor in parallel to the fan motor terminals; and feedback control means for applying a voltage across fan motor terminals according to said signal.

13. A motor control circuit for a computer system fan motor wherein the voltage applied to the fan motor varies between a lower voltage and a higher voltage, comprising:

a temperature measuring circuit for outputting a signal representative of the voltage to be applied across fan motor terminals, the temperature measuring circuit comprising a thermistor and a sensor amplifier, the sensor amplifier comprising a comparator for comparing the voltage across the thermistor with a reference voltage and for outputting a difference signal representative of the difference between the voltage across the thermistor and the reference voltage, said sensor amplifier comprising circuitry for adding to said difference signal a signal representative of a lower value of said signal;

a feedback control arrangement for applying a voltage across fan motor terminals according to said signal, the feedback control arrangement comprising subtracting circuitry, fan control circuitry, and a feedback loop, said subtracting circuitry receiving the signal outputted by said temperature sensing circuit and a signal outputted by said feedback loop, and outputting to the fan control circuitry a signal representative of the difference between the signal outputted by said temperature sensing circuit and the signal outputted by said feedback loop, said fan control circuit applying across said fan motor terminals a voltage representative of the signal supplied by the subtracting circuitry, said feedback loop outputting to said subtracting circuitry a signal representative of the voltage applied to the fan motor terminals.

14. The circuit of claim 13 further comprising circuitry for stopping the supply of voltage across the fan motor terminals, irrespective of said signal; wherein said circuitry for stopping comprise a transistor, the collector of which is connected to the base of a power transistor, the emitter of which is connected to the ground, and the base of which receives a fan stopping signal.

15. The circuit of claim 13 further comprising circuitry for applying a pulse of the higher voltage to the fan motor terminals when the motor is started, irrespective of the output of the temperature measuring circuit.

16. The circuit of claim 13 further comprising a capacitor in parallel to the fan motor terminals.

17. The circuit of claim 13, wherein the subtracting circuitry comprise an amplifier, the positive input of which receives the signal outputted by said temperature sensing circuit and the negative input of which receives a signal outputted by said feedback loop.

18. The circuit of claim 13, wherein the fan control circuitry comprises a power transistor, the collector of which is connected to one of the fan motor terminals, the emitter of which is connected to one of the ground and power supply, and the base of which is connected to the output of said subtracting means, the other of said fan motor terminals being connected to the other of said ground and power supply.

19. The circuit of claim 13, wherein the feedback loop comprises a comparator for comparing the voltage across the fan motor terminals to a reference voltage, and for outputting a signal representative of said difference.

20. The circuit of claim 13, wherein a highest voltage applied to said feedback control circuitry is less than a highest voltage applied to the fan motor terminals, and wherein the feedback loop compensate for the difference between said highest voltage applied to the fan motor terminal and said highest voltage applied to said feedback control circuit.

21. A computer comprising a fan motor connected to a circuit, wherein the voltage applied to the fan motor varies between a lower voltage and a higher voltage, the circuit comprising:

a temperature measuring circuit for outputting a signal representative of the voltage to be applied across fan motor terminals, the temperature measuring circuit comprising a thermistor and a sensor amplifier, the sensor amplifier comprising a comparator for comparing the voltage across the thermistor with a reference voltage and for outputting a difference signal representative of the difference between the voltage across the thermistor and the reference voltage, said sensor amplifier comprising circuitry for adding to said difference signal a signal representative of a lower value of said signal;

a capacitor in parallel to the fan motor terminals; and a feedback control arrangement for applying a voltage across fan motor terminals according to said signal, the feedback control arrangement comprising subtracting circuitry, fan control circuitry, and a feedback loop, said subtracting circuitry receiving the signal outputted by said temperature sensing circuit and a signal outputted by said feedback loop, and outputting to the fan control circuitry a signal representative of the difference between the signal outputted by said temperature sensing circuit and the signal outputted by said feedback loop, said fan control circuit applying across said fan motor terminals a voltage representative of the signal supplied by the subtracting circuitry, said feedback loop outputting to said subtracting circuitry a signal representative of the voltage applied to the fan motor terminals.

22. A motor control circuit for a computer system fan motor, comprising a temperature measuring circuit for outputting a signal representative of the voltage to be applied across fan motor terminals, a capacitor in parallel to the fan motor terminals, and a feedback control arrangement for applying a voltage across fan motor terminals according to said signal.

* * * * *